US011241757B2

(12) United States Patent
Atsumi et al.

(10) Patent No.: US 11,241,757 B2
(45) Date of Patent: Feb. 8, 2022

(54) LASER PROCESSING METHOD AND DEVICE

(71) Applicant: HAMAMATSU PHOTONICS K.K., Hamamatsu (JP)

(72) Inventors: Kazuhiro Atsumi, Hamamatsu (JP); Koji Kuno, Hamamatsu (JP); Masayoshi Kusunoki, Hamamatsu (JP); Tatsuya Suzuki, Hamamatsu (JP); Kenshi Fukumitsu, Hamamatsu (JP); Fumitsugu Fukuyo, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 474 days.

(21) Appl. No.: 16/380,660

(22) Filed: Apr. 10, 2019

(65) Prior Publication Data
US 2019/0232422 A1    Aug. 1, 2019

Related U.S. Application Data

(60) Continuation of application No. 15/255,926, filed on Sep. 2, 2016, now Pat. No. 10,293,433, which is a
(Continued)

(30) Foreign Application Priority Data

Jan. 9, 2004  (JP) ................................ 2004-004304

(51) Int. Cl.
*B23K 26/04* (2014.01)
*B28D 5/00* (2006.01)
(Continued)

(52) U.S. Cl.
CPC .......... *B23K 26/048* (2013.01); *B23K 26/046* (2013.01); *B23K 26/0648* (2013.01);
(Continued)

(58) Field of Classification Search
None
See application file for complete search history.

(56) References Cited

U.S. PATENT DOCUMENTS 3,629,545 A * 12/1971 Graham ............... B23K 26/359
219/121.72
4,546,231 A * 10/1985 Gresser ................. B28D 1/221
219/121.72
(Continued)

FOREIGN PATENT DOCUMENTS

CN    1160228 A    9/1997
EP    1338371 A1   8/2003
(Continued)

OTHER PUBLICATIONS

Office Action from related (not counterpart) U.S. Appl. No. 10/585,451 dated Apr. 20, 2011 (15 pages).
(Continued)

*Primary Examiner* — Dana Ross
*Assistant Examiner* — Kuangyue Chen
(74) *Attorney, Agent, or Firm* — Faegre Drinker Biddle & Reath LLP

(57) ABSTRACT

A laser processing method which can efficiently perform laser processing while minimizing the deviation of the converging point of a laser beam in end parts of an object to be processed is provided.
This laser processing method comprises a preparatory step of holding a lens at an initial position set such that a converging point is located at a predetermined position within the object; a first processing step (S11 and S12) of emitting a first laser beam for processing while holding the lens at the initial position, and moving the lens and the ltd object relative to each other along a main surface so as to form a modified region in one end part of a line to cut; and a second processing step (S13 and S14) of releasing the lens
(Continued)

from being held at the initial position after forming the modified region in the one end part of the line to cut, and then moving the lens and the object relative to each other along the main surface while adjusting the gap between the lens and the main surface after the release, so as to form the modified region.

7 Claims, 11 Drawing Sheets

Related U.S. Application Data division of application No. 14/099,236, filed on Dec. 6, 2013, now Pat. No. 9,511,449, which is a continuation of application No. 10/585,343, filed as application No. PCT/JP2004/018594 on Dec. 13, 2004, now Pat. No. 8,624,153.

(51) Int. Cl.
| | |
|---|---|
| H01L 21/67 | (2006.01) |
| B23K 26/53 | (2014.01) |
| B23K 26/40 | (2014.01) |
| B23K 26/38 | (2014.01) |
| B23K 26/06 | (2014.01) |
| B23K 26/046 | (2014.01) |
| H01L 21/78 | (2006.01) |
| B23K 101/40 | (2006.01) |
| B23K 103/00 | (2006.01) |

(52) U.S. Cl.
CPC .............. *B23K 26/38* (2013.01); *B23K 26/40* (2013.01); *B23K 26/53* (2015.10); *B28D 5/0011* (2013.01); *H01L 21/67092* (2013.01); *H01L 21/78* (2013.01); *B23K 2101/40* (2018.08); *B23K 2103/50* (2018.08); *B23K 2103/56* (2018.08)

(56) References Cited

U.S. PATENT DOCUMENTS

| | | | |
|---|---|---|---|
| 4,562,333 A | 12/1985 | Taub et al. | |
| 4,769,523 A | 9/1988 | Tanimoto et al. | |
| 4,944,922 A | 7/1990 | Hayashi | |
| 5,017,796 A | 5/1991 | Makita | |
| 5,038,016 A | 8/1991 | Robertson et al. | |
| 5,122,648 A | 6/1992 | Cohen et al. | |
| 5,254,833 A | 10/1993 | Okiyama | |
| 5,334,816 A * | 8/1994 | Sugiyama | B23K 26/032 219/121.75 |
| 5,392,110 A | 2/1995 | Yojima et al. | |
| 5,463,202 A | 10/1995 | Kurosawa et al. | |
| 5,543,365 A | 8/1996 | Wills et al. | |
| 5,594,235 A | 1/1997 | Lee | |
| 5,622,540 A | 4/1997 | Stevens | |
| 5,624,153 A | 4/1997 | Censullo, Jr. | |
| 5,637,244 A | 6/1997 | Erokhin | |
| 5,698,120 A | 12/1997 | Kurosawa et al. | |
| 5,776,220 A | 7/1998 | Allaire et al. | |
| 5,826,772 A | 10/1998 | Ariglio et al. | |
| 5,883,356 A | 3/1999 | Bauer et al. | |
| 5,925,268 A | 7/1999 | Britnell | |
| 5,990,944 A | 11/1999 | Abe | |
| 6,055,829 A | 5/2000 | Witzmann et al. | |
| 6,175,096 B1 | 1/2001 | Nielsen | |
| 6,211,488 B1 | 4/2001 | Hoekstra et al. | |
| 6,252,197 B1 | 6/2001 | Hoekstra et al. | |
| 6,257,224 B1 | 7/2001 | Yoshino et al. | |
| 6,259,058 B1 | 7/2001 | Hoekstra | |
| 6,322,958 B1 | 11/2001 | Hayashi | |
| 6,353,216 B1 | 3/2002 | Oren et al. | |
| 6,407,360 B1 | 6/2002 | Choo et al. | |
| 6,411,838 B1 | 6/2002 | Nordstrom et al. | |
| 6,420,678 B1 | 7/2002 | Hoekstra | |
| 6,489,588 B1 * | 12/2002 | Hoekstra | B23K 26/0736 219/121.67 |
| 6,580,054 B1 | 6/2003 | Liu et al. | |
| 6,590,181 B2 | 7/2003 | Choo et al. | |
| 6,660,963 B2 | 12/2003 | Hoekstra et al. | |
| 6,720,522 B2 | 4/2004 | Ikegami et al. | |
| 6,992,026 B2 | 1/2006 | Fukuyo et al. | |
| 7,027,155 B2 | 4/2006 | Cordingley et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,595,895 B2 | 9/2009 | Kurita et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 8,058,103 B2 | 11/2011 | Fukumitsu et al. | |
| 8,183,131 B2 | 5/2012 | Fukuyo et al. | |
| 8,227,724 B2 | 7/2012 | Fukuyo et al. | |
| 8,247,734 B2 | 8/2012 | Fukuyo et al. | |
| 8,263,479 B2 | 9/2012 | Fukuyo et al. | |
| 8,283,595 B2 | 10/2012 | Fukuyo et al. | |
| 8,304,325 B2 | 11/2012 | Fujii et al. | |
| 8,314,013 B2 | 11/2012 | Fujii et al. | |
| 8,523,636 B2 | 9/2013 | Uchiyama | |
| 8,685,838 B2 | 4/2014 | Fukuyo et al. | |
| 8,828,306 B2 | 9/2014 | Uchiyama | |
| 8,841,580 B2 | 9/2014 | Fukumitsu et al. | |
| 8,852,698 B2 | 10/2014 | Fukumitsu | |
| 8,927,900 B2 | 1/2015 | Fukuyo et al. | |
| 2002/0006765 A1 | 1/2002 | Michel et al. | |
| 2002/0036264 A1 * | 3/2002 | Nakasuji | G01N 23/225 250/306 |
| 2002/0140949 A1 | 10/2002 | Sasaki et al. | |
| 2002/0153500 A1 | 10/2002 | Fordahl et al. | |
| 2002/0170896 A1 | 11/2002 | Choo et al. | |
| 2003/0209528 A1 | 11/2003 | Choo et al. | |
| 2004/0002199 A1 * | 1/2004 | Fukuyo | B23K 26/40 438/460 |
| 2004/0206882 A1 | 10/2004 | Banks et al. | |
| 2005/0202596 A1 | 9/2005 | Fukuyo et al. | |
| 2005/0272223 A1 | 12/2005 | Fujii et al. | |
| 2006/0144828 A1 | 7/2006 | Fukumitsu et al. | |
| 2007/0085099 A1 | 4/2007 | Fukumitsu et al. | |
| 2007/0158314 A1 | 7/2007 | Fukumitsu et al. | |
| 2007/0252154 A1 | 11/2007 | Uchiyama et al. | |
| 2008/0035611 A1 | 2/2008 | Kuno et al. | |
| 2008/0037003 A1 | 2/2008 | Atsumi et al. | |
| 2008/0218735 A1 * | 9/2008 | Atsumi | B23K 26/048 356/72 |
| 2008/0251506 A1 | 10/2008 | Atsumi et al. | |
| 2009/0008373 A1 | 1/2009 | Muramatsu et al. | |
| 2009/0032509 A1 | 2/2009 | Kuno et al. | |
| 2009/0098713 A1 | 4/2009 | Sakamoto | |
| 2009/0107967 A1 | 4/2009 | Sakamoto et al. | |
| 2009/0117712 A1 | 5/2009 | Sakamoto et al. | |
| 2009/0166342 A1 | 7/2009 | Kuno et al. | |
| 2009/0166808 A1 | 7/2009 | Sakamoto et al. | |
| 2009/0250446 A1 | 10/2009 | Sakamoto | |
| 2009/0261083 A1 | 10/2009 | Osajima et al. | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |

(56) References Cited

U.S. PATENT DOCUMENTS

| | | |
|---|---|---|
| 2010/0012632 A1 | 1/2010 | Sakamoto |
| 2010/0012633 A1 | 1/2010 | Atsumi et al. |
| 2010/0025386 A1 | 2/2010 | Kuno et al. |
| 2010/0032418 A1 | 2/2010 | Kuno et al. |
| 2010/0184271 A1 | 7/2010 | Sugiura et al. |
| 2010/0200550 A1 | 8/2010 | Kumagai |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027972 A1 | 2/2011 | Fukuyo et al. |
| 2011/0037149 A1 | 2/2011 | Fukuyo et al. |

FOREIGN PATENT DOCUMENTS

| | | |
|---|---|---|
| EP | 1707298 A1 | 10/2006 |
| EP | 1716960 A1 | 11/2006 |
| JP | S53-145564 A | 12/1978 |
| JP | 04-111800 A | 4/1992 |
| JP | 04-244910 A | 9/1992 |
| JP | H6-122084 A | 5/1994 |
| JP | 06-190578 A | 7/1994 |
| JP | 06-252260 | 9/1994 |
| JP | 06-252485 | 9/1994 |
| JP | H6-100711 B2 | 12/1994 |
| JP | 07-040336 A | 2/1995 |
| JP | 07-236985 | 9/1995 |
| JP | 08-014968 | 1/1996 |
| JP | 09-260310 A | 10/1997 |
| JP | 10-163780 A | 6/1998 |
| JP | H10-189496 A | 7/1998 |
| JP | 10-202381 | 8/1998 |
| JP | H10-288734 A | 10/1998 |
| JP | 11-138896 A | 5/1999 |
| JP | 11-163403 A | 6/1999 |
| JP | 11-177137 A | 7/1999 |
| JP | 11-221684 A | 8/1999 |
| JP | 11-267861 A | 10/1999 |
| JP | 11-345785 | 12/1999 |
| JP | 2000-009991 A | 1/2000 |
| JP | 2000-015467 A | 1/2000 |
| JP | 2000-219528 A | 8/2000 |
| JP | 2000-306865 A | 11/2000 |
| JP | 2001-093864 A | 4/2001 |
| JP | 2001-340979 A | 12/2001 |
| JP | 2002-107120 A | 4/2002 |
| JP | 2002-205181 A | 7/2002 |
| JP | 2002-219591 A | 8/2002 |
| JP | 2002-321080 A | 11/2002 |
| JP | 2003-001457 A | 1/2003 |
| JP | 2003-002677 A | 1/2003 |
| JP | 2003-251476 A | 9/2003 |
| JP | 2004-188422 A | 7/2004 |
| JP | 2004-337902 A | 12/2004 |
| JP | 2004-337903 A | 12/2004 |
| JP | 46-24989 B2 | 2/2011 |
| WO | WO-02/22301 A1 | 3/2002 |
| WO | WO-2004/052586 A1 | 6/2004 |

OTHER PUBLICATIONS

U.S. Office Action dated Apr. 14, 2011, issued in U.S. Appl. No. 10/585,660, filed May 8, 2008.

U.S. Office Action dated Apr. 20, 2011, issued in U.S. Appl. No. 10/585,451, filed May 4, 2007.

X. Liu et al., "Laser Ablation and Micromachining with Ultrashort Laser Pulses," IEEE Journal of Quantum Electronics, vol. 33, No. 10, Oct. 1997, pp. 1706-1716.

K. Hayashi, "Inner Glass Marking by Harmonics of Solid-state Laser", Proceedings of the 45th Laser Materials Processing Conference, Dec. 1998, pp. 23-28, with English abstract.

T. Sano et al., "Evaluation of Processing Characteristics of Silicon with Picosecond Pulse Laser," Preprints of the National Meeting of Japan Welding Society, No. 66, Apr. 2000, pp. 72-73, with English translation.

K. Miura et al., "Formation of Photo-induced Structures in Glasses with Femtosecond Laser," Proceedings of 42nd Laser Materials Processing Conference, Nov. 1997, pp. 105-111.

T. Miyazaki, "Laser Beam Machining Technology," Published by Sangyo-Tosho Inc., May 31, 1991, First Edition, pp. 9-10, with English translation.

T. Yajima et al., New Version Laser Handbook, published by Asakusa Shoten, Jun. 15, 1989, pp. 666-669, with English translation.

Tooling Machine Series, Laser Machining, published by Taiga Shuppan, Inc., Sep. 10, 1990, pp. 91-96, with English translation.

T. Hidetsugu, "Stealth Dicing, Its Principles and Features: A Technology Most Suitable for Dicing Very Thin Semiconductor Wafers," Electronic Material, No. 9, 2002, pp. 17-21, with English translation.

F. Fukuyo et al., "Stealth Dicing Technology for Ultra Thin Wafer", presented at 2003 ICEP (International Conference on Electronics Packaging), Apr. 16-18, 2003, Tokyo, Japan, pp. 266-269.

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner

Fig.4
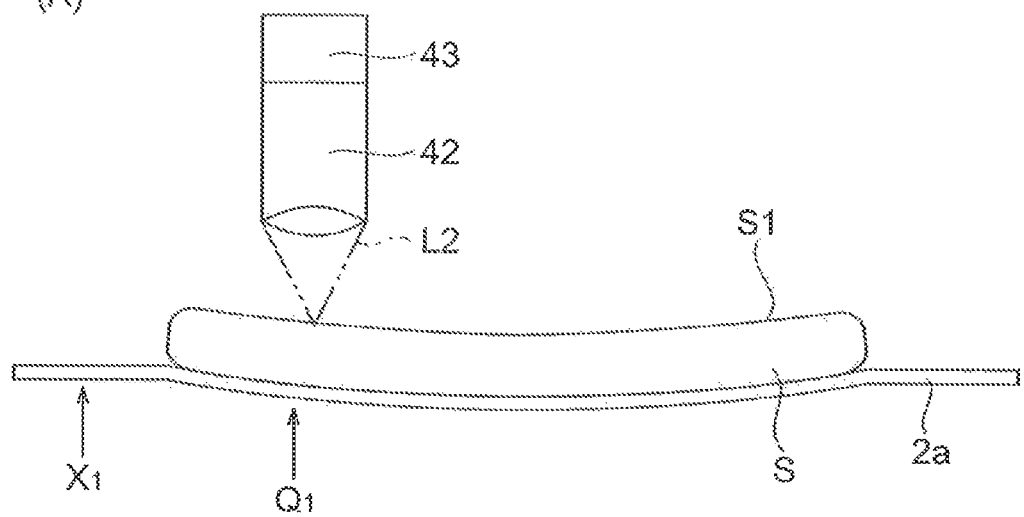
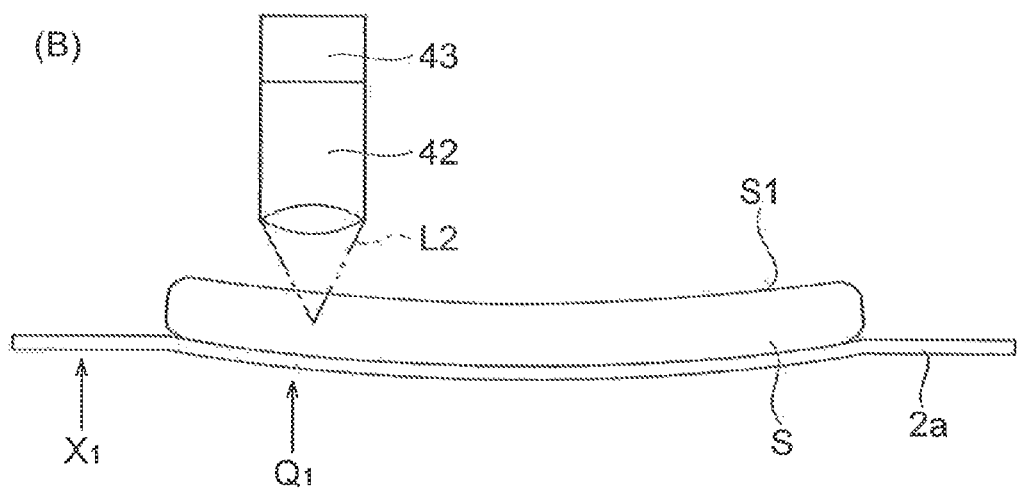
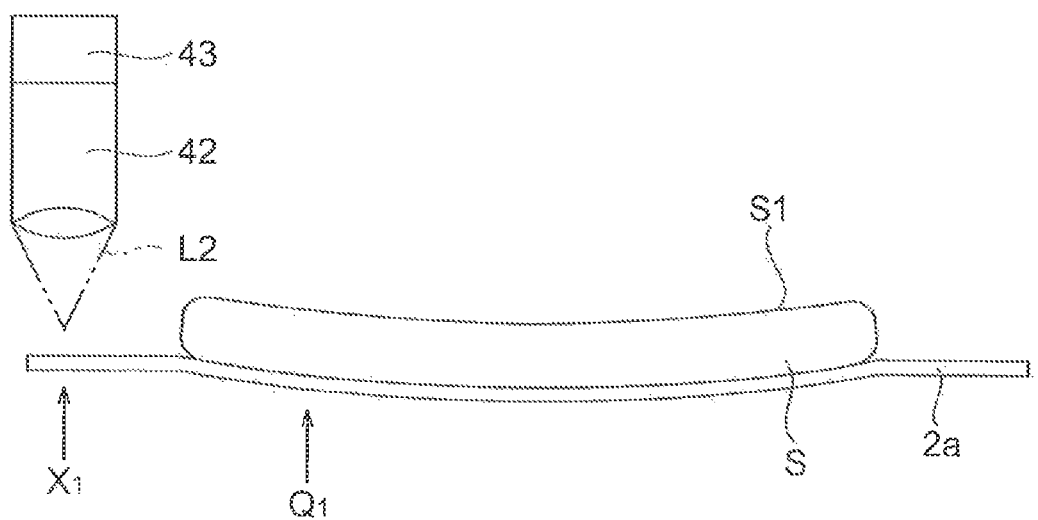

Fig.6
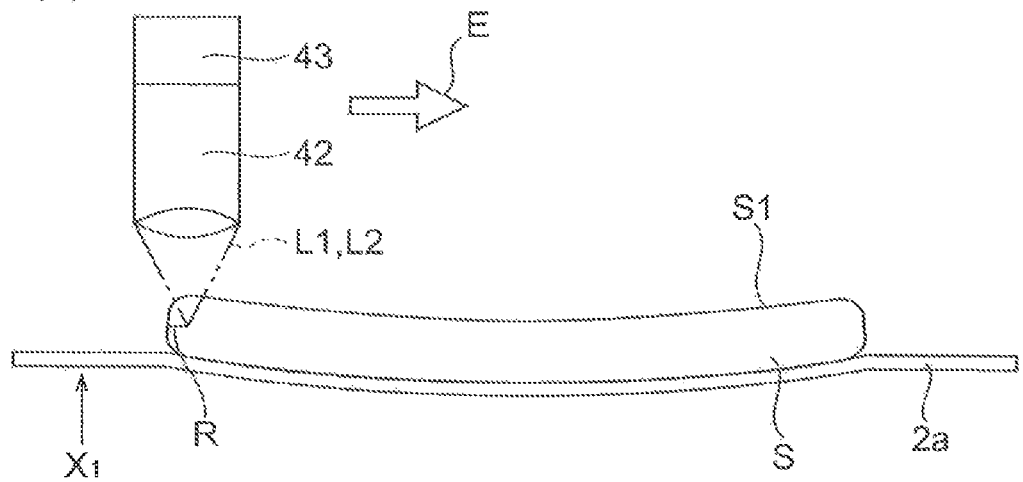
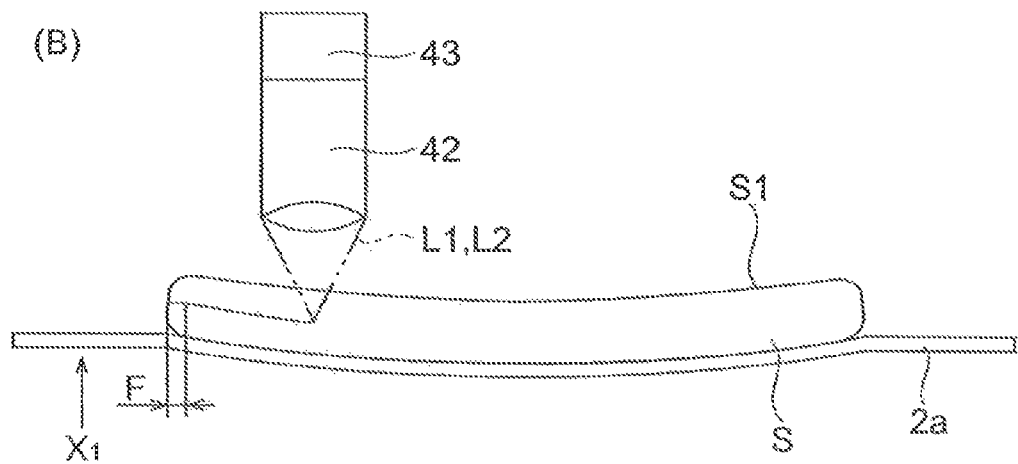
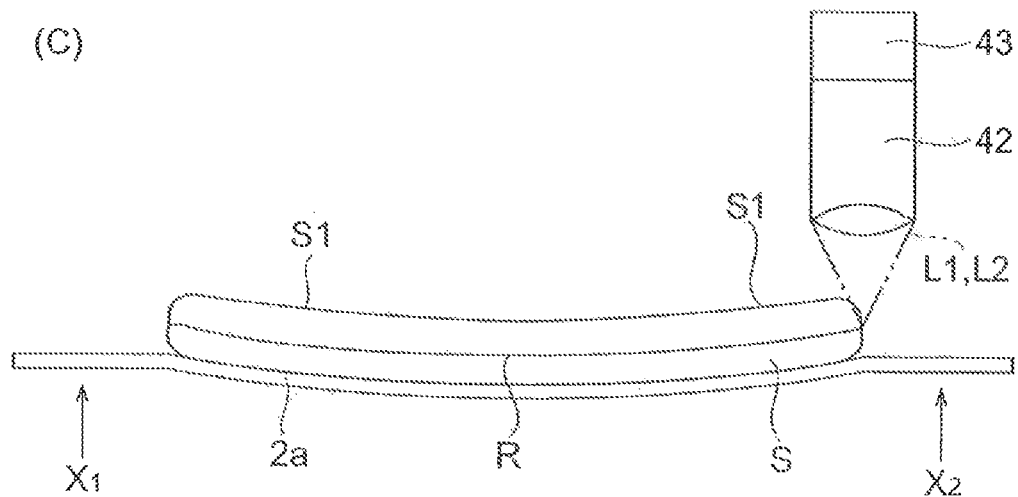

Fig. 10
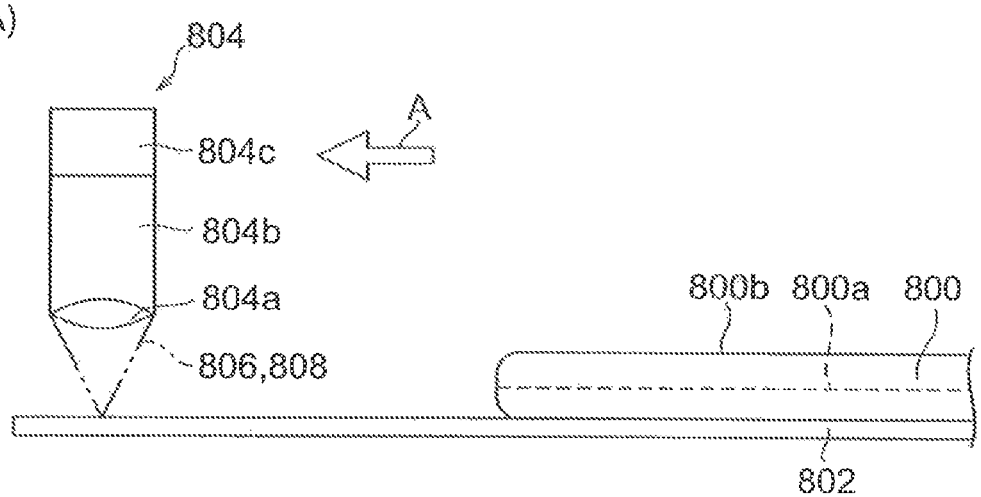
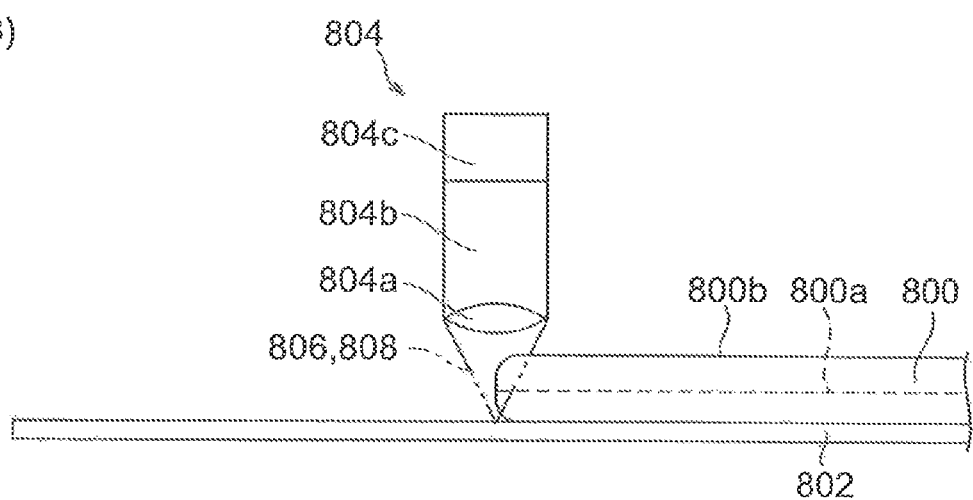
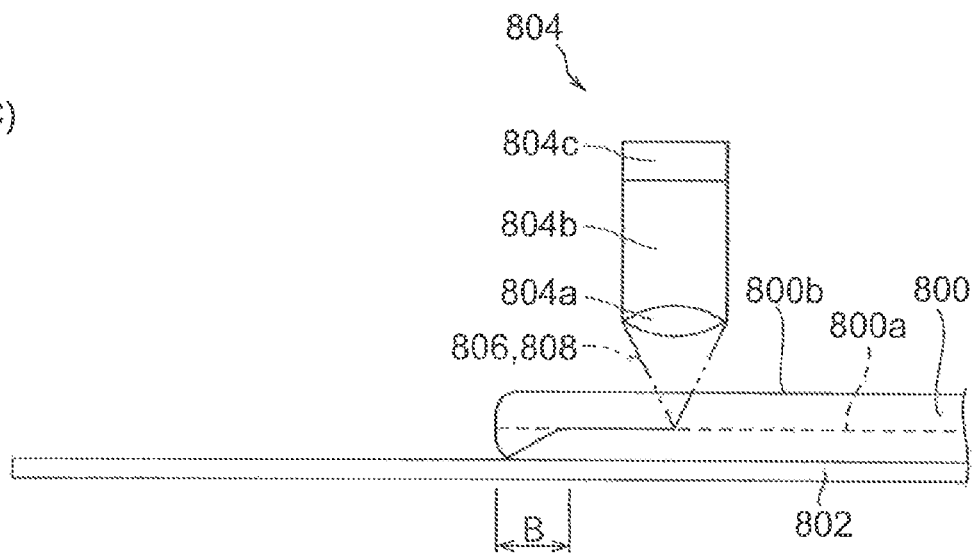

LASER PROCESSING METHOD AND DEVICE

TECHNICAL FIELD

The present invention relates to a laser processing method and laser processing apparatus for processing an object to be processed by irradiating the object with a laser beam.

BACKGROUND ART

Known as a conventional laser processing technique is one in which measurement means (a contact-type displacement meter, an ultrasonic rangefinder, or the like) for measuring the main surface height of the object to be processed is arranged in parallel with a condenser lens for converging a laser beam with a predetermined gap therebetween (see, for example, FIGS. 6 to 10 of Patent Document 1). In such a laser processing technique, while scanning the object with the laser beam along its main surface, the main surface height of the object is measured by the measurement means, and the condenser lens is driven along its optical axis such that the distance between the condenser lens and the main surface of the object becomes constant according to thus measured main surface at the time when the measurement point is positioned directly under the condenser lens.

Known as a technique for processing an object to be processed whose main surface has irregularities, on the other hand, is one in which the planarity in the whole part to be processed is measured by planarity measuring means (a planarity ureter comprising a projector and a reflected light receiver) as a preparation for processing, and the object is processed according to thus measured planarity (see, for example, Patent Document 2).

Patent Document 1: Japanese Patent Application Laid-Open No. 2002-219591
Patent Document 2: Japanese Patent Application Laid-Open No. HEI 11-345785

DISCLOSURE OF THE INVENTION

Problem to be Solved by the Invention

However, the following problem to be overcome exists in the above-mentioned laser processing apparatus disclosed in Patent Document 1. When the laser beam irradiation is started from a position on the outside of the object to be processed, so as to perform processing while the laser beam and the object are moved along the main surface of the latter, the measurement means proceeds with measurement from the outside of the object to the inside thereof. When the condenser lens is driven according to the measured value of main surface height obtained by this measurement, the converging point of the laser beam may deviate from its predetermined position in end parts of the object to be processed.

Though the planarity of the main surface of the object to be processed can accurately be grasped when the technique disclosed in Patent Document 2 is used, the same part must be scanned twice, i.e., before and during the actual processing, which takes time and lowers the processing efficiency.

Therefore, it is an object of the present invention to provide a laser processing method and laser processing apparatus which can efficiently perform laser processing while minimizing the deviation of the laser beam converging point in the end parts of the object.

Means for Solving Problem

The inventors conducted various studies in order to overcome the above-mentioned problem. First, a processing method in which a first laser beam for processing and a second laser beam for measuring the displacement of a main surface of an object to be processed are emitted to the object on the same axis was studied. Details of this study will now be explained with reference to FIGS. 10(A) to 10(C).

FIG. 10(A) shows a processing preparatory phase in the case where a silicon wafer 800 secured to a dicing film 802 is processed with a laser beam emitted from a laser unit 804. The laser unit 804 includes a condenser lens 804a for converging the laser beam onto the silicon wafer 800, a lens holder 804b for holding the condenser lens 804a, and a piezoelectric actuator 804c which holds the lens holder 804b such that the latter can freely advance and retract with respect to the silicon wafer 800. The laser processing apparatus including the laser unit 804 further comprises a laser light source and the like which are not described. In the state of FIG. 10(A), irradiation with a first laser beam 806 for processing and a second laser beam 808 for measuring the displacement of a main surface 800b of the silicon wafer 800 is started, while a stage (not depicted) mounting the silicon wafer 800 is moved such that the silicon wafer 800 shifts in the direction of arrow A. The silicon wafer 800 is to be processed with the first laser beam 806 at a position corresponding to a line to cut 800a.

As the silicon wafer 800 shifts in the direction of arrow A in FIG. 10(A), the optical axis of the first laser beam 806 and second laser beam 808 reaches a position where it intersects the silicon wafer 800. The piezoelectric actuator $04c causes the lens holder 804b to advance/retract with respect to the silicon wafer 800 such that an astigmatism signal detected from reflected light of the second laser beam 808 becomes a predetermined value. Therefore, the piezoelectric actuator 804c retracts from the state of FIG. 10(B), so as to raise the lens holder 804b and condenser lens 804a. However, since the silicon wafer 800 keeps shifting in the direction of arrow A in FIG. 10(A), a time lag occurs until the lens holder 804b and condenser lens 804a rise to a predetermined position so that the converging point of the first laser beam 806 is positioned at the line to cut 800a. Also, the astigmatism signal may vary so much that the converging point of the first laser beam 806 fluctuates.

Therefore, as shown in FIG. 10(C), a part other than the line to cut 800a is processed with the laser in an area B until the first laser beam 806 is in focus with the line to cut 800a so as to attain a stable state. For example, assuming that the silicon wafer 800 has a thickness of 100 μm, and that a time delay of 15 mS occurs, the length of the area B is theoretically 1.5 mm when the processing speed is 100 mm/S.

Though FIGS. 10(A) to 10(C) relate to the silicon wafer 800 having an ideally high planarity, there may be a case where end parts are warped upward. An example of a silicon wafer having an end part warped upward will be explained with reference to FIGS. 11(A) to 11(C).

FIG. 11(A) shows a processing preparatory phase in the case where a silicon wafer 810 secured to a dicing film 802 is processed with a laser beam emitted from a laser unit 804. This laser unit $04 is the same as that explained with reference to FIGS. 10(A) to 10(C). The silicon wafer 810 has an end part warped upward. A line to cut 810a in the silicon wafer 810 is set so as to be positioned equidistantly from a main surface 810b.

As the silicon wafer 810 shifts in the direction of arrow A in FIG. 11(A), the optical axis of the first laser beam 806 and second laser beam 808 reaches a position where it intersects the silicon wafer 810 as shown in FIG. 11(B). The piezoelectric actuator 804c causes the lens holder 804b to advance/retract with respect to the silicon wafer 810 such that an astigmatism signal detected from reflected light of the second laser beam 808 becomes a predetermined value. Therefore, the piezoelectric actuator 804c retracts from the state of FIG. 11(B), so as to raise the lens holder 804h and condenser lens 804a. However, since the silicon wafer 810 keeps shifting in the direction of arrow A in FIG. 11(A), a time lag occurs until the lens holder 804b and condenser lens 804a rise to a predetermined position so that the converging point of the first laser beam 806 is positioned at the line to cut 810a. Also, since an end part of the silicon wafer 810 is warped upward, the gap from the position of the dotted line C to the actual position of the main surface 810b in FIG. 11(B) causes an overshoot when the lens holder 804b and condenser lens 804a rise to the predetermined position.

Therefore, as shown in FIG. 11(C), a part other than the line to cut 810a is processed with the laser in an area D until the first laser beam 806 is in focus with the line to cut 810a so as to attain a stable state. The length of the area D tends to be longer by the overshoot than the length of the area B in FIG. 10(C). Hence, the inventors take notice of the processing in end parts of the object to be processed. The present invention is achieved according to these findings.

The present invention provides a laser processing method for irradiating an object to be processed with a first laser beam while converging the first laser beam with a lens such that a converging point is positioned within the object, and forming a modified region within the object along a line to cut in the object; the method comprising a preparatory step of holding the lens at an initial position with respect to a main surface of the object, the initial position being set so that the converging point is located at a predetermined position within the object; a first processing step of emitting the first laser beam while holding the lens at the initial position, and moving the lens and the object relative to each other along the main surface so as to Rum the modified region in one end part of the line to cut; and a second processing step of releasing the lens from being held at the initial position after forming the modified region in the one end part, and then moving the lens and the object relative to each other along the main surface while adjusting a gap between the lens and the main surface so as to form the modified region.

Since the modified region is formed in one end part of the line to cut while the lens is held at the initial position, the modified region can be formed while excluding the influence of fluctuations in the shape of end parts in the object as much as possible in the laser processing method of the present invention. After the modified region is formed in one end part of the line to cut, the lens is released from being held, and the modified region is formed in the remaining part while adjusting the lens position, whereby the modified region can be formed at a predetermined position within the object.

It will be preferred in the laser processing method of the present invention if, in the second processing step, the first laser beam and a second laser beam for measuring a displacement of the main surface are converged by the lens onto the object on the same axis, and the lens is released from being held after the quantity of reflected light of the second laser bean reflected by the main surface exceeds a predetermined threshold. Since the first and second laser beams are converged by the lens so as to be emitted on the same axis, the converging point of the first laser beam can be prevented from deviating from a predetermined position within the object because of a vibration of a stage mounting the object, for example. The quantity of reflected light varies depending on the distance from the reflecting surface. Therefore, when a predetermined threshold is set to a value corresponding to the height of the main surface, and a location where the quantity of reflected light becomes the predetermined threshold is assumed to correspond to an outer edge of the main surface of the object to be processed, the lens can be released from being held.

It will also e preferred in the laser processing method of the present invention if, in the second processing step, the first laser beam and a second laser beam for measuring a displacement of the main surface are converged by the lens onto the object on the same axis, and the lens is released from being held after an amount of change in the quantity of reflected light of the second laser beam reflected by the main surface becomes a maximum value. Since the first and second laser beams are converged by the lens so as to be emitted on the same axis, the converging point of the first laser beam can be prevented from deviating from a predetermined position within the object because of a vibration of a stage mounting the object, for example. Since the quantity of reflected light varies depending on the distance from the reflecting surface, the displacement of the main surface seems to be acute in the vicinity of the location where the amount of change in the quantity of reflected light becomes an extreme value. Therefore, assuming that this location corresponds to an outer edge of the main surface of the object to be processed, the lens can be released from being held.

It will also be preferred if the laser processing method of the present invention further comprises a transition step of holding the lens so as to keep the lens from being driven toward the main surface after the second processing step. Since the lens is held so as not to be driven toward the main surface after forming the modified region, a smooth transition is possible when shifting to the processing of the next line to cut, for example.

It will also be preferred in the laser processing method of the present invention if, in the transition step, the first laser beam and a second laser beam for measuring a displacement of the main surface are converged by the lens onto the object on the same axis, and the lens is held so as to be kept from being driven after the quantity of reflected light of the second laser beam reflected by the main surface becomes smaller than a predetermined threshold. The quantity of reflected light varies depending on the distance from the reflecting surface. Therefore, when a predetermined threshold is set to a value corresponding to the height of the main surface, and a location Where the quantity of reflected light becomes the predetermined threshold is assumed to correspond to an outer edge of the main surface of the object to be processed, the lens can be held so as to be kept from being driven.

It will also be preferred in the laser processing method of the present invention if, in the transition step, the first laser beam and a second laser beam for measuring a displacement of the main surface are converged by the lens onto the object on the same axis, and the lens is held so as to be kept from being driven after an amount of change in the quantity of reflected light of the second laser beam reflected by the main surface becomes a minimum value. Since the quantity of reflected light varies depending on the distance from the reflecting surface, the displacement of the main surface seems to be acute in the vicinity of the location where the amount of change in the quantity of reflected light becomes a minimum value. Therefore, assuming that this location corresponds to an outer edge of the main surface of the object to be processed, the lens can be held so as to be kept from being driven.

It will also be preferred in the laser processing method of the present invention if the line to cut includes first and second lines to cut; respective displacements of the main surface in unit time zones are successively stored in the second processing step of the first line to cut; the lens is held in the transition step of the first line to cut such that, with respect to the main surface, the lens is placed at a position based on the displacement stored in the unit time zone earlier by a predetermined number than the unit time zone where the lens is held so as to be kept from being driven in the transition step of the first line to cut; and the position where the lens is held in the transition step of the first line to cut is employed as the initial position in the preparatory step of the second line to cut. Since the position of the lens with respect to the main surface in the preparatory step of the next line to cut is set to the position based on the displacement stored in the unit time zone earlier by a predetermined number than the unit time zone corresponding to the time when the lens is held so as to be kept from being driven, the influence of fluctuations in the shape of end parts can be excluded as much as possible.

The present invention provides a laser processing apparatus for irradiating an object to be processed with a first laser beam while converging the first laser beam with a tens such that a converging point is positioned within the object, and forming a modified region within the object along a line to cut in the object; the apparatus comprising a lens for converging the first laser beam onto the object; moving means for moving the object and the lens relative to each other along a main surface of the object; holding means for holding the lens such that the lens freely advances and retracts with respect to the main surface; and control means for controlling respective behaviors of the moving means and holding means; wherein the control means controls the holding means so as to hold the lens at an initial position where the converging point is located at a predetermine position within the object; wherein, while emitting the first laser beam with the lens being held at the initial position, the control means controls the moving means so as to move the object and the lens relative to each other along the main surface, thereby forming the modified region in one end part of the line to cut; and wherein, after forming the modified region in the one end part of the line to cut, the control means controls the holding means so as to release the lens from being held at the initial position and hold the lens while adjusting a gap between the lens and the main surface, and controls the moving means so as to move the lens and the object relative to each other along the main surface, thereby forming the modified region.

Since the modified region is formed in one end part of the line to cut while the lens is held at the initial position, the laser processing apparatus of the present invention can form the modified region while excluding the influence of fluctuations in the shape of end parts in the object as much as possible. After the modified region is formed at one end part of the line to cut, the lens is released from being held, and the modified region is formed in the remaining part while adjusting the lens position, whereby the modified region can be formed at a predetermined position within the object.

It be preferred in the laser processing apparatus of the present invention if the first laser beam and a second laser beam for measuring a displacement of the main surface are converged by the lens onto the object on the same axis, and the control means controls the holding means so as to release the lens from being held after the quantity of reflected light of the second laser beam reflected by the main surface exceeds a predetermined threshold. Since the first and second laser beams are converged by the lens so as to be emitted on the same axis, the converging point of the first laser beam can be prevented from deviating from a predetermined position within the object because of a vibration of a stage mounting the object, for example. The quantity of reflected light varies depending on the distance from the reflecting surface. Therefore, when a predetermined threshold is set to a value corresponding to the height of the main surface, and a location where the quantity of reflected light becomes the predetermined threshold is assumed to correspond to an outer edge of the main surface of the object to be processed, the lens can be released from being held.

It will also be preferred in the laser processing apparatus of the present invention if the first laser beam and a second laser beam for measuring a displacement of the main surface are converged by the lens onto the object on the same axis, and the control means controls the holding means so as to release the lens from being held after an amount of change in the quantity of reflected light of the second laser beam reflected by the main surface becomes a maximum value. Since the first and second laser beams are converged by the lens so as to be emitted on the same axis, the converging point of the first laser beam can be prevented from deviating from a predetermined position within the object because of a vibration of a stage mounting the object, for example. Since the quantity of reflected light varies depending on the distance from the reflecting surface, the displacement of the main surface seems to be acute in the vicinity of the location where the amount of change in the quantity of reflected light becomes an extreme value. Therefore, assuming that this location corresponds to an outer edge of the main surface of the object to be processed, the lens can be released from being held.

It will also be preferred in the laser processing apparatus of the present invention if, after forming the modified region in the one end part of the line to cut, the control means controls the holding means so as to release the lens from being held at the initial position and hold the lens while adjusting a gap between the lens and the main surface, and controls the moving means so as to move the lens and the object relative to each other along the main surface, thereby forming the modified region; and the control means controls the holding means so as to hold the lens such that the lens is kept from being driven toward the main surface and move the lens and the object relative to each other along the main surface. Since the lens is held so as not to be driven toward the main surface after forming the modified region, a smooth transition is possible when shifting to the processing of the next line to cut, for example.

It will also be preferred in the laser processing apparatus of the present invention if the first laser beam and a second laser beam for measuring a displacement of the main surface are converged by the lens onto the object on the same axis, and the control means controls the holding means so as to hold the lens such that the lens is kept from being driven toward the main surface after the quantity of reflected light of the second laser beam reflected by the main surface becomes smaller than a predetermined threshold. The quantity of reflected light varies depending on the distance from the reflecting surface. Therefore, when a predetermined threshold is set to a value corresponding to the height of the main surface, and a location where the quantity of reflected light becomes the predetermined threshold is assumed to correspond to an outer edge of the main surface of the object to be processed, the lens can be held so as to be kept from being driven.

It will also be preferred in the laser processing apparatus of the present invention if the first laser beam and a second laser beam for measuring a displacement of the main surface are converged by the lens onto the object on the same axis, and the control means controls the holding means so as to hold the lens such that the lens is kept from being driven toward the main surface after an amount of change in the quantity of reflected light of the second laser beam reflected by the main surface becomes a minimum value. Since the quantity of reflected light varies depending on the distance from the reflecting surface, the displacement of the main surface seems to be acute in the vicinity of the location where the amount of change in the quantity of reflected light becomes a minimum value. Therefore, assuming that this location corresponds to an outer edge of the main surface of the object to be processed, the lens can be held so as to be kept from being driven.

It will also be preferred in the laser processing apparatus of the present invention if the line to cut includes first and second lines to cut, the apparatus further comprises displacement storage means for successively storing respective displacements of the main surface in unit time zones, and the control means sets a position based on the displacement stored in the unit time zone earlier by a predetermined number than the unit time zone where the lens is held so as to be kept from being driven in the first line to cut as the initial position in the second line to cut. Since the position of the lens with respect to the main surface in the preparatory step of the next line to cut is set to the position based on the displacement stored in the unit time zone earlier by a predetermined number than the unit time zone corresponding to the time when the lens is held so as to be kept from being driven, the influence of fluctuations in the shape of end parts can be excluded as much as possible.

Effect of the Invention

The laser processing method and laser processing apparatus of the present invention can efficiently carry out laser processing while minimizing the deviation of the converging point of a laser beam in end parts of an object to be processed.

BRIEF DESCRIPTION OF THE DRAWINGS

FIG. 4 is a view for explaining the laser processing method in accordance with an embodiment of the present invention.

FIG. 6 is a view for explaining the laser processing method in accordance with the embodiment.

FIG. 10 is a view for explaining details of the studies led to the present invention.

EXPLANATIONS OF NUMERALS

1 . . . laser processing apparatus, 2 . . . stage, 3 . . . laser head unit, 4 . . . optical system main part, 5 . . . objective lens unit, 6 . . . laser emitting apparatus, 7 . . . control unit, S . . . object, R . . . modified region, 42 . . . processing objective lens, 43 . . . actuator, 13 . . . laser head, 44 . . . laser diode, 45 . . . light-receiving part.

BEST MODES FOR CARRYING OUT THE INVENTION

The findings of the present invention can easily be understood in view of the following detailed descriptions with reference to the accompanying drawings, which are represented for the purpose of illustration only. Embodiments of the present invention will now be explained with reference to the accompanying drawings. When possible, parts identical to each other will be referred to with numerals identical to each other without repeating their overlapping explanations.

Figure 1:
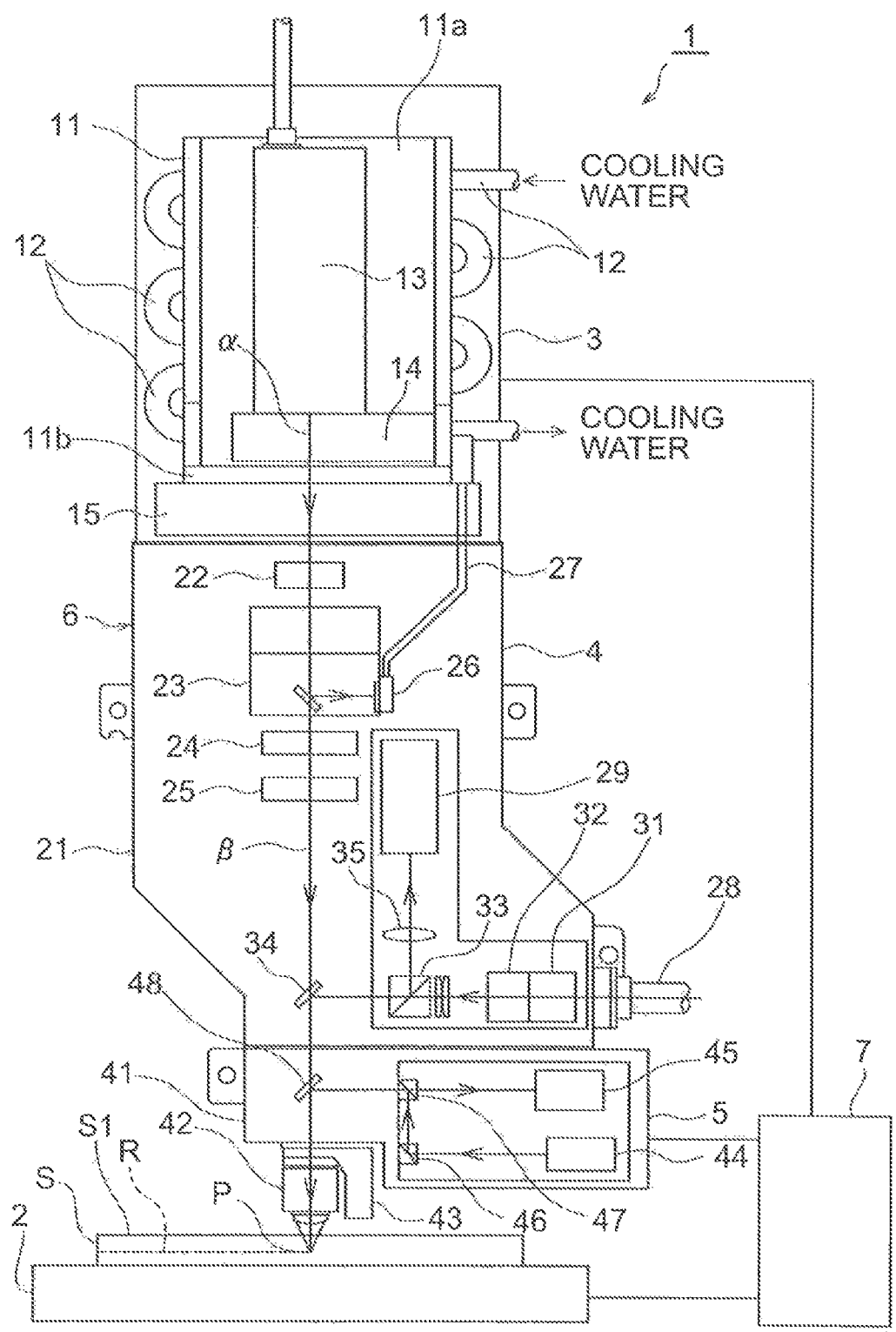
FIG. 1 is a view showing the configuration of the laser processing apparatus in accordance with an embodiment of the present invention.

The laser processing apparatus in accordance with an embodiment of the present invention will be explained with reference to FIG. 1. As shown in FIG. 1, this laser processing apparatus 1 is one which irradiates a planar object to be processed S mounted on a stage 2 (moving means) with a processing laser beam L1 (first laser beam) such that a converging point P is positioned within the object 5, so as to form a modified region R caused by multiphoton absorption within the object S. The stage 2 is movable upward/downward and leftward/rightward and rotatable, whereas a laser emitting apparatus 6 mainly constituted by a laser head unit 3, an optical system main part 4, and an objective lens unit 5 is disposed above the stage 2. The laser processing apparatus 1 also comprises a control unit 7 (control means), which outputs control signals for controlling behaviors of the stage 2 and laser emitting apparatus 6 (the movement of stage 2, emission of laser beams from the laser emitting apparatus 6, etc.) thereto.

The laser head unit 3 is detachably attached to an upper end part of the optical system main part 4. The laser head unit 3 includes an L-shaped cooling jacket 11. Embedded in a vertical wall 11a of the cooling jacket 11 is a cooling pipe 12 in a winding state, through which cooling water circulates. Attached to the front face of the vertical wall 11a are a laser head 13 which emits the processing laser beam L1 downward, and a shutter unit 14 for selectively opening and closing an optical path of the processing laser beam L1 emitted from the laser head 13. This can prevent the laser head 13 and shutter unit 14 from overheating. For example, the laser head 13 uses an Nd:YAG laser and emits a pulsed laser beam having a pulse width of 1 μs or shorter as the processing laser beam L1.

In the laser head unit 3, an adjuster 15 for adjusting the inclination of the cooling jacket 11 and the like is attached to the lower face of a bottom wall 11b of the cooling jacket 11. The adjuster 15 is used for aligning an optical axis α of the processing laser beam L1 emitted from the laser head 13 with an axis β which is set in the optical system main part 4 and objective lens unit 5 such as to extend vertically.

Namely, the laser head unit 3 is attached to the optical system main part 4 by way of the adjuster 15. When the inclination of the cooling jacket 11 or the like is adjusted by the adjuster 15 thereafter, the inclination of the laser head 13 or the like is adjusted in conformity to the movement of the cooling jacket 11. As a consequence, the processing laser beam L1 advances into the optical system main part 4 while in a state where its optical axis α coincides with the axis β. The bottom wall 11b of the cooling jacket 11, the adjuster 15, and a housing 21 of the optical system main part 4 are formed with through holes through which the processing laser beam L1 passes.

On the axis β within the housing 21 of the optical system main part 4, a beam expander 22 for enlarging the beam size of the processing laser beam L1 emitted from the laser head 13, an optical attenuator 23 for adjusting the output of the processing laser beam L1, an output observation optical system 24 for observing the output of the processing laser beam L1 adjusted by the optical attenuator 23, and a polarization adjusting optical system 25 for adjusting the polarization of the processing laser beam L1 are arranged in this order from the upper side to the lower side. A beam damper 26 for absorbing the eliminated laser beam is attached to the optical attenuator 23, and is connected to the cooling jacket 11 by way of a heat pipe 27. This can prevent the beam damper 26 having absorbed the laser beam from overheating.

For observing the object S mounted on the stage 2, a light guide 28 for guiding an observation visible ray is attached to the housing 21 of the optical system main part 4, whereas a CCD camera 29 is disposed within the housing 21. The observation visible ray is guided by the light guide 28 into the housing 21, successively passes through a field stop 31, a reticle 32, a dichroic mirror 33, and the like, and then is reflected by a dichroic mirror 34 disposed on the axis β. The reflected observation visible ray advances downward on the axis β and irradiates the object S. On the other hand, the processing laser beam L1 is transmitted through the dichroic mirror 34.

The reflected light beam of the observation visible ray reflected by a surface S1 of the object S advances upward on the axis β, and is reflected by the dichroic mirror 34. The light beam reflected by the dichroic mirror 34 is further reflected by the dichroic mirror 33, so as to pass through an imaging lens 35, etc., thereby entering the CCD camera 29. An image of the object S captured by the CCD camera 29 is displayed on a monitor (not depicted).

The objective lens unit 5 is detachably attached to the lower end part of the optical system main part 4. Since the objective lens unit 5 is positioned by a plurality of positioning pins with respect to the lower end part of the optical system main part 4, the axis β set in the optical system main part 4 and the axis β set in the objective lens unit 5 can easily be aligned with each other. By way of an actuator 43 (holding means) using a piezoelectric device, a processing objective lens 42 is mounted to the lower end of the housing 41 of the objective lens unit 5 while in a state where the optical axis coincides with the axis β. The housing 21 of the optical system main part 4 and the housing 41 of the objective lens unit 5 are formed with through holes through which the processing laser beam L1 passes. The peak power density of the processing laser beam L1 converged by the processing objective lens 42 is at least $1 \times 10^8$ (W/cm$^2$) at the converging point P.

In order to position the converging point P of the processing laser beam L1 at a predetermined depth from the surface S1 of the object S, a laser diode 44 for emitting a rangefinding laser beam L2 (second laser beam) and a light-receiving part 45 (light-receiving means) are disposed within the housing 41 of the objective lens unit 5. The rangefinding laser beam L2 is emitted from the laser diode 44, and is successively reflected by a mirror 46 and a half mirror 47, and then by a dichroic mirror 48 disposed on the axis β. The reflected rangefinding laser beam L2 advances downward on the axis β, and passes through the processing objective lens 42, thereby irradiating the surface S1 of the object S. On the other hand, the processing laser beam L1 passes through the dichroic mirror 48.

The reflected light beam of the rangefinding laser beam L2 reflected by the surface S1 of the object S reenters the processing objective lens 42, and advances upward on the axis β, so as to be reflected by the dichroic mirror 48. The reflected light beam of the rangefinding laser beam L2 reflected by the dichroic mirror 48 passes through the half mirror 47, so as to enter the light-receiving part 45, and is converged on a four-divided position detecting device (displacement acquiring means) in which a photodiode is equally divided into four. According to the converged image pattern of the reflected light beam of the rangefinding laser beam L2 converged onto the four-divided position detecting device, it can be detected where the converging point of the rangefinding laser beam L2 due to the processing objective lens 42 is positioned with respect to the surface S1 of the object S. Information about the converged image pattern of the reflected light beam of the rangefinding laser beam L2 converged on the four-divided position detecting device is outputted to the control unit 7. According to this information, the control unit 7 outputs a control signal for indicating to the actuator 43 a position for holding the processing objective lens 42.

Physically, the control unit 7 comprises an interface for exchanging signals with the stage 2 and laser emitting apparatus 6, a CPU (central processing unit), and a storage device such as memory or HDD. According to a program stored in the storage device, the CPU performs a predetermined information processing operation and outputs results of the information processing as control signals to the stage 2 and laser emitting apparatus 6.

Figure 2:
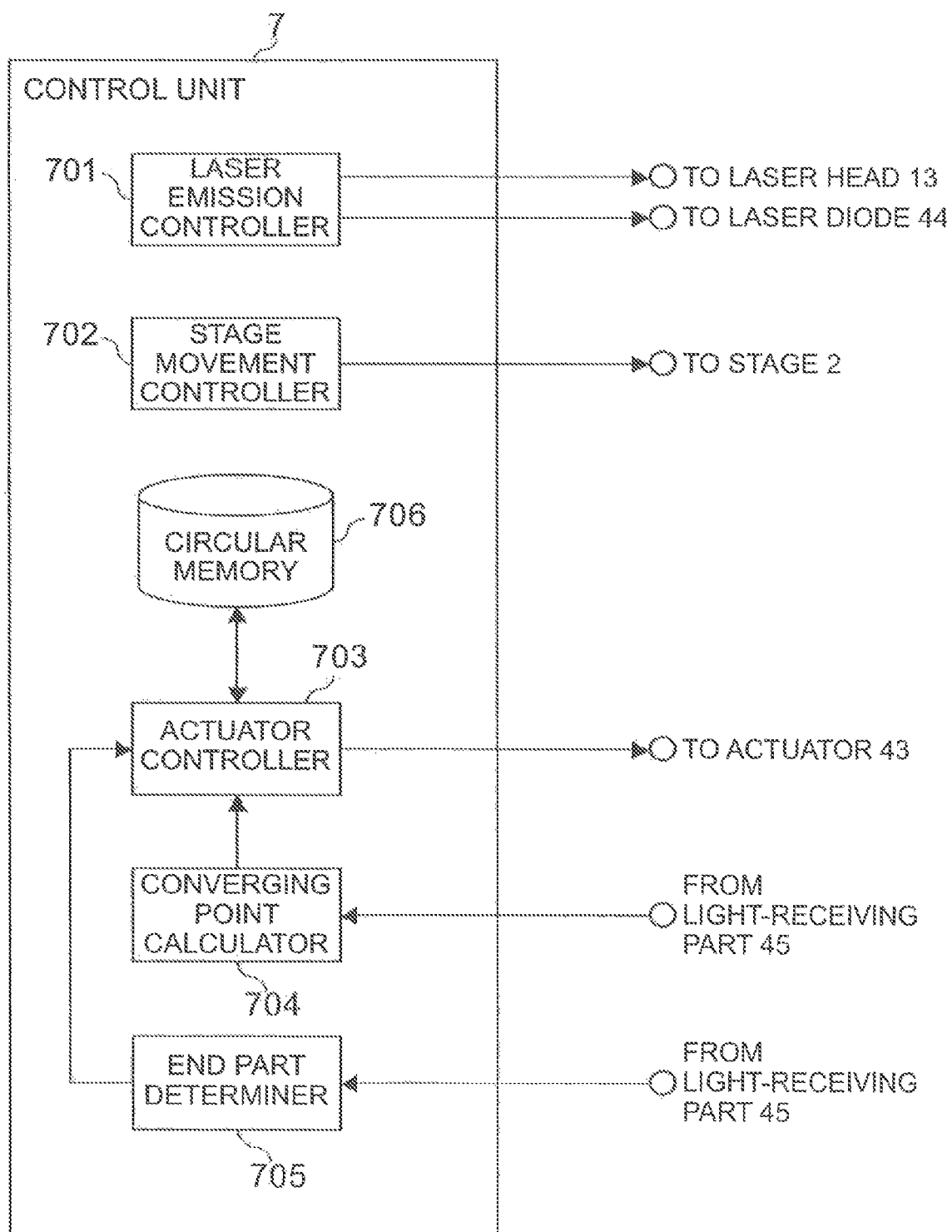
FIG. 2 is a diagram showing a functional configuration of a control unit provided in the laser processing apparatus in accordance with the embodiment.

FIG. 2 shows a functional configuration of the control unit 7. Functionally, as shown in FIG. 2, the control unit 7 comprises a laser emission controller 701, a stage movement controller 702, an actuator controller 703, a converging point calculator 704, an end part determiner 705, and a circular memory 706 (displacement storage means). The laser emission controller 701 is a part which outputs signals for controlling emissions of the processing laser beam L1 and rangefinding laser beam L2 to the laser head 13 of the laser head unit 3 and the laser diode 44 of the objective lens unit 5, respectively. The stage movement controller 702 is a part which outputs a control signal for controlling the movement of the stage 2 thereto. The actuator controller 703 is a part which outputs a control signal for controlling the driving of the actuator 43 of the objective lens unit 5 to the actuator 43. The actuator controller 703 is also a part which causes the circular memory 706 to store the amount of movement of the actuator 43. The amount of movement varies according to the displacement of the main surface S1 of the object, and thus can be taken as an amount indicative of the displacement of the main surface S1. The converging point calculator 704 is a part which calculates the distance between the object S and the converging point of the range finding laser beam L2 according to an astigmatism signal outputted from the light-receiving part 45 of the objective lens unit 5. The end part determiner 705 is a part which determines whether the processing objective lens 42 is at a position corresponding to an end part of the object S or not according to the quantity of light received by the light-receiving part 45. The circular memory 706 is one which stores the amount of movement of the actuator 43. The circular memory 706 comprises 64 channels of storage areas, and successively stores respective amounts of movement into the storage areas. Operations of the individual functional constituents will be explained later.

An outline of a laser processing method carried out by thus configured laser processing apparatus 1 will now be explained. First, the object S is mounted on the stage 2, and the stage 2 is moved such that the converging point P of the processing laser beam L1 is positioned within the object S. The initial position of the stage 2 is determined by the thickness and refractive index of the object 5, the numerical aperture of the processing objective lens 42, etc.

Subsequently, the processing laser beam L1 is emitted from the laser head 13, the rangefinding laser beam L2 is emitted from the laser diode 44, and the stage 2 is moved such that the processing laser beam L1 and rangefinding laser beam L2 converged by the processing objective lens 42 scan a desirable line (line to cut) of the object S. Here, the light-receiving part 45 detects the reflected light beam of the rangefinding laser beam L2, and the control unit 7 controls the actuator 43 in a feedback fashion such that the converging point P of the processing laser beam L1 is always positioned at a predetermined depth from the surface S1 of the object S, whereby the position of the processing objective lens 42 is minutely adjusted along the axis β.

Therefore, even when the surface S1 of the object S wobbles, for example, a modified region. R caused by multiphoton absorption can be formed at a position located at a predetermined depth from the surface S1. Forming the linear modified region R within the planar object S as such can generate a cleavage from the linear modified region R acting as a start point, whereby the object S can be cut easily with a high precision along the linear modified region R.

The laser processing method using the laser processing apparatus 1 of this embodiment will be explained more specifically. The explanation of the laser processing method will also illustrate the movement of the laser processing apparatus 1. The laser processing method in accordance with this embodiment can be divided into a preparatory step of setting an initial position of the processing objective lens 42 with respect to the wafer-like object 5, and a processing step of emitting the processing laser beam L1 so as to form a modified region. Each of the preparatory step and processing step will be explained.

(Preparatory Step) First, the preparatory step of setting the initial position of the processing objective lens 42 with respect to the wafer-like object S will be explained.

Figure 3:
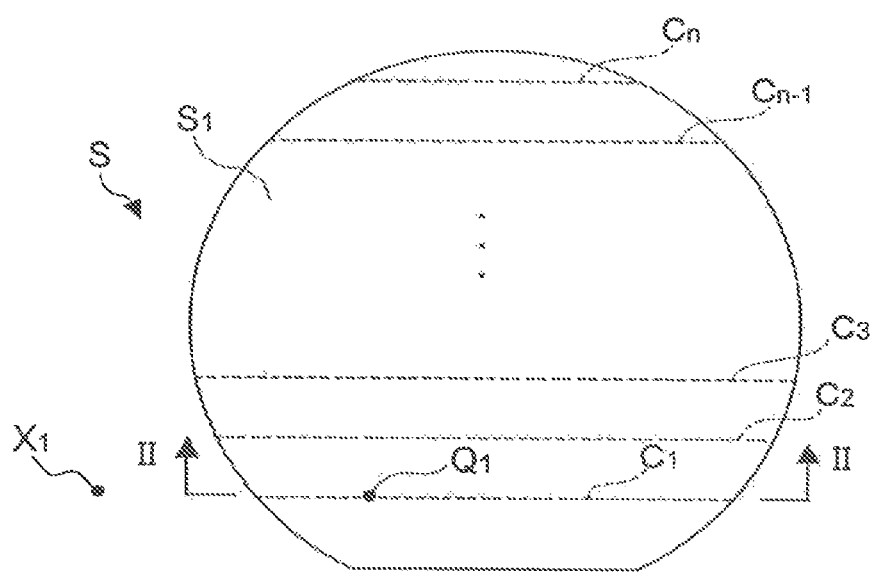
FIG. 3 is a view showing an object to be processed for explaining the embodiment.

FIG. 3 is a plan view of the object S. In the object 5, n lines to cut $C_1$ to $C_n$ are set and are successively subjected to laser processing. First, the height of the stage 2 (see FIG. 1) is adjusted such that, at a point $Q_1$ on the first line to cut $C_1$, the converging point is located at a predetermined position within the object S. Using thus adjusted height as the initial position, the stage 2 is moved such that the processing objective lens 42 is positioned at a point $X_1$ on an extension of the line to cut $C_1$.

More detailed explanations will be set forth with reference to FIGS. 4(A) to 4(C). FIGS. 4(A) to 4(C) are views showing the cross section II-II of FIG. 3. For easier understanding, the hatching indicating the cross section is omitted in FIGS. 4(A) to 4(C). As shown in FIG. 4(A), the object S is attracted and secured to the stage 2 by way of a dicing film 2a. The dicing film 2a is secured with a dicing ring (not depicted).

As shown in FIG. 4(A), the stage 2 moves such that the processing objective lens 42 is placed at a position corresponding to the point $Q_1$ on the line to cut $C_1$ in the object S. The actuator 43 holding the processing objective lens 42 is in a state expanded by 25 μm from the most contracted state. This amount of expansion, i.e., 25 μm, is set as one half of the maximum amount of expansion of the actuator 43, i.e., 50 μm. In this state, the stage 2 is moved up/down so that a reflected light beam of the observation visible ray is in focus. When a large error occurs as the stage 2 moves up and down, it will be preferred if the actuator 43 is moved to a desirable position while storing the astigmatism signal at this time, the actuator 43 is returned to the original position, the stage 2 is moved (roughly), and then the actuator 43 is minutely adjusted to a position corresponding to the stored astigmatism signal.

Subsequently, as shown in FIG. 4(B), the stage 2 is further raised by a predetermined distance (hereinafter referred to as processing height) from the state of FIG. 4(A), such that the distance between the surface S1 of the object S and the processing objective lens 42 is set shorter by the processing height than the distance in FIG. 4(A). Here, assuming that the focal point of the visible range and the converging point of the laser beam coincide with each other, the processing laser beam L1 is converged at a position corresponding to the value of product of the processing height from the surface S1 and the refractive index of the object S at the laser wavelength within the object S. When the object S is a silicon wafer having a refractive index of 3.6 (at a wavelength of 1.06 μm) and a processing height of 10 μm, for example, the processing laser beam L1 is converged at a position of 3.6×10=36 μm. An astigmatism signal is obtained from the reflected light beam of the rangefinding laser beam L2 in the state shown in FIG. 4(B), and the value of this astigmatism signal is employed as a reference value.

The stage 2 is moved as it is from the state shown in FIG. 4(B), and attains a wait state as shown in FIG. 4(C) when the processing objective lens 42 reaches a point $X_1$ on the extension of the line to cut $C_1$. The position of the processing objective lens 42 with respect to the object S in the vertical direction shown in FIGS. 4(B) and 4(C) is the initial position.

Figure 5:
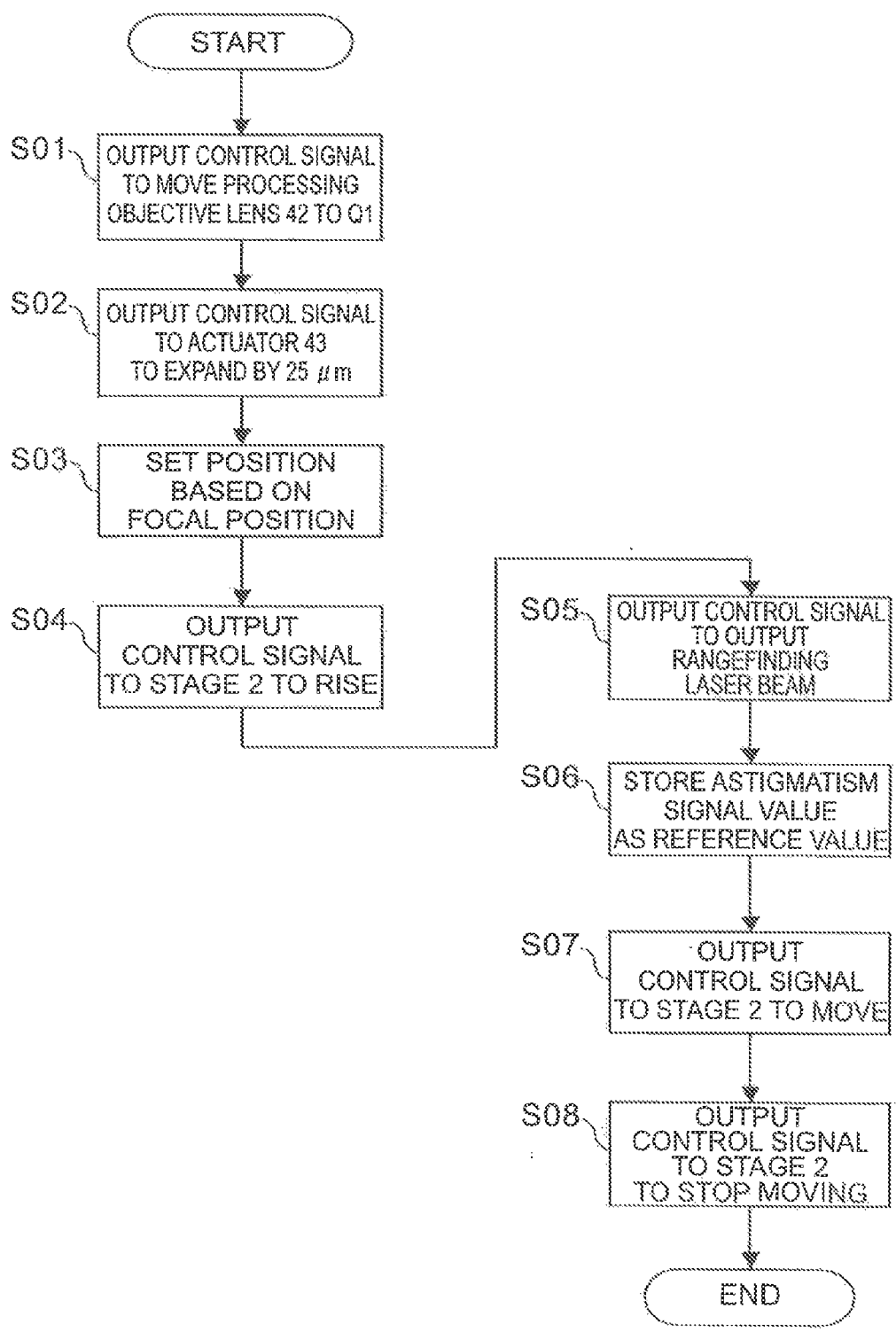
FIG. 5 is a flowchart for explaining the laser processing method in accordance with the embodiment.

Operations of the laser processing apparatus 1 in this preparatory step will be explained with reference to the flowchart shown in FIG. 5. The stage controller 702 of the control unit 7 outputs a control signal to the stage 2 such that the processing objective lens 42 moves to the point $Q_1$ on the $C_1$ (step S01). In response to the output of this control signal, the stage 2 moves. Further, the actuator controller 703 of the Control unit 7 outputs a control signal to the actuator 43 so as to make the latter expand by 25 μm (step S02). In response to the output of this control signal, the actuator 43 expands by 25 μm. In this state, the stage 2 is moved up/down so that the observation visible ray is in focus therewith, and a focal position of the observation visible ray is set, whereby the processing objective lens 42 and the object S attain the state explained with reference to FIG. 4(A) (step S03).

The stage movement controller 702 of the control unit 7 outputs a control signal to the stage 2 so as to make the latter rise by a predetermined processing height (e.g., 10 μm) (step S04). In response to the output of this control signal, the stage rises by 10 µm, whereby the processing objective lens 42 and the object S attain the state explained with reference to FIG. 4(B).

The laser emission controller 701 of the control unit 7 outputs a control signal to the laser diode 44 so as to make the latter emit the rangefinding laser beam L2 (step S05). In response to the output of this control signal, the laser diode 44 emits the rangefinding laser beam L2, whereas its reflected light beam reflected by the surface S1 of the object S is received by the four-divided position detecting device in the light-receiving part 45. In response to the light received, signals are outputted to the converging point calculator 704 and the end part determiner 705.

The converging point calculator 704 holds the value of astigmatism signal in this state as a reference value (step S06). Subsequently, the stage movement controller 702 outputs a control signal to the stage 2 such that the processing objective lens 42 moves to a position corresponding to $X_1$ on an extension of the line to cut $C_1$ in the object S (step S07). The stage 2 moves in response to the output of this control signal. When the processing objective lens 42 reaches the position corresponding to $X_1$ on the extension of the line to cut $C_1$ in the object S, the stage movement controller 702 outputs a control signal to the stage 2 so as to make the latter stop moving (step S08).

(Processing Step) The processing step of emitting the processing laser beam L1 and rangefinding laser beam L2 will now be explained.

The explanation will be set forth with reference to FIGS. 6(A) to 6(C) showing the cross section II-II of FIG. 3 as with FIGS. 4(A) to 4(C). For easier understanding, the hatching indicating the cross section is omitted in FIGS. 6(A) to 6(C). Subsequent to the state of FIG. 4(C), FIG. 6(A) shows a state where the processing objective lens 42 has started forming a modified region on the line to cut $C_1$. The actuator 43 is fixed at the amount of expansion set in FIG. 4(C). The processing laser beam L1 and rangefinding laser beam L2 are emitted before the state of FIG. 6(A) after the state of FIG. 4(C). The stage 2 moves such that the processing objective lens 42 shifts in the direction of arrow E in the drawing.

The rangefinding laser beam L2 is reflected less by the dicing film 2a so that the total quantity of light reflected thereby is smaller, whereas the total quantity of reflected light increases in the object S. Namely, the total quantity of reflected light beam of the rangefinding laser beam L2 detected by the four-divided position detecting device in the light-receiving part 45 (see FIG. 1) increases, whereby it can be determined that the processing objective lens 42 is located at the position intersecting the line to cut $C_1$ in the object S when the total quantity of reflected light beam exceeds a predetermined threshold. Therefore, when the total light quantity detected by the four-divided position detecting device in the light-receiving part 45 (see FIG. 1) is greater than the predetermined threshold, the processing objective lens 42 is assumed to be located at one end of the line to cut $C_1$ (in the state corresponding to FIG. 6(A)), the expansion amount of the actuator 43 at this time is released from being held, and the expansion amount control of the actuator 43 is started such that the astigmatism signal becomes the reference value held at step S06 at predetermined intervals (e.g., at individual sampling points). Hence, when the processing objective lens moves in the direction of arrow E in FIG. 6(A), the state shown in FIG. 6(B) is attained. As shown in FIG. 6(B), a modified region R is formed by a predetermined processing height in area F (one end part). After the modified region R is formed by a predetermined processing height in this area F, the processing objective lens 42 moves along the line to cut $C_1$, and forms the modified region R with the processing laser beam L1. During this period, the actuator 43 is adjusted such that the astigmatism signal obtained from the reflected light beam of the rangefinding laser beam L2 becomes the above-mentioned reference value.

When the processing objective lens 42 further moves in the direction of arrow E in FIG. 6(A) from the state shown in FIG. 6(B), the processing objective lens 42 is located at the other end of the line to cut $C_1$ as shown in FIG. 6(C). When the processing objective lens 42 reaches a position outside of the object S, a state opposite to that explained with reference to FIG. 6(A) is attained, whereby the total quantity of the reflected light beam of the rangefinding laser beam L2 detected by the four-divided position detecting device in the light-receiving part 45 (see FIG. 1) decreases. Therefore, when the total quantity of light detected by the four-divided position detecting device in the light-receiving part 45 (see FIG. 1) becomes smaller than a predetermined threshold, the processing objective lens 42 is assumed to be located at a position corresponding to one end of the line to cut $C_1$ (in the state corresponding to FIG. 6(C)), and the amount of expansion of the actuator at this time is held. While keeping the amount of expansion of the actuator 43, the stage 2 is moved such that the processing objective lens 42 reaches the position of $X_2$ in FIG. 6(C), so as to be ready for the processing of the next line to cut $C_2$ (transition step).

Figure 7:
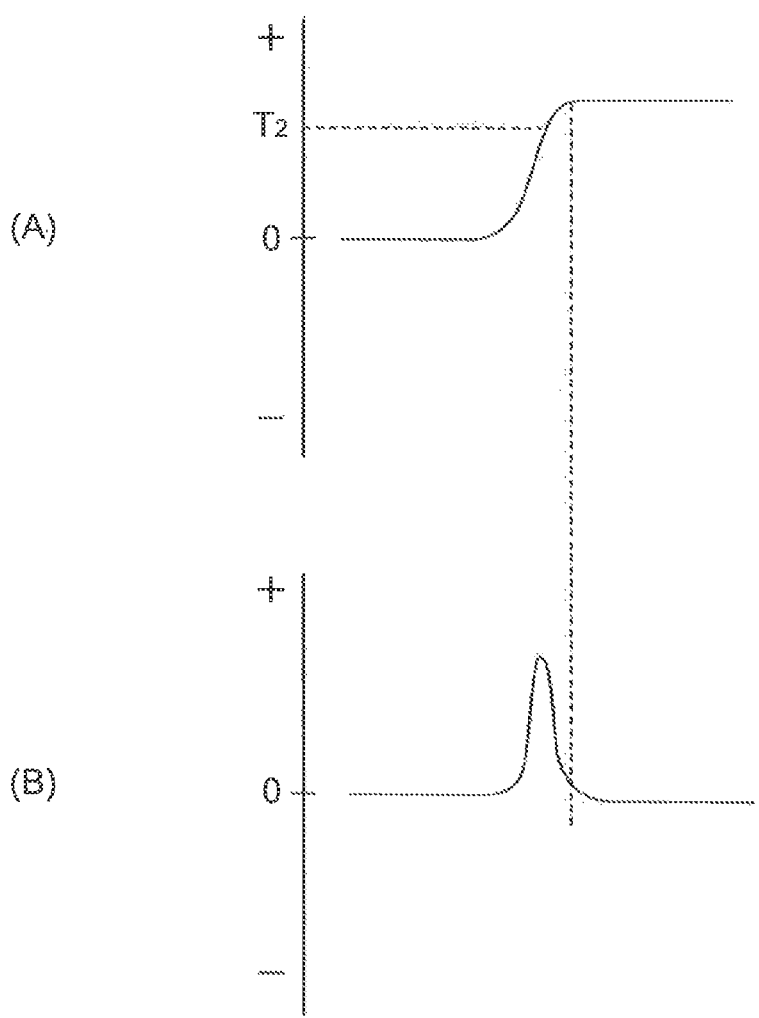
FIG. 7 is a chart for explaining the laser processing method in accordance with the embodiment.

Though the processing objective lens 42 having reached a position corresponding to one end of the line to cut $C_1$ (FIG. 6(A)) is detected according to the fact that the total light quantity detected by the four-divided position detecting device in the light-receiving part 45 (see FIG. 1) exceeds a predetermined threshold in the foregoing explanation, this is not restrictive, whereby other criteria may also be employed. An example of such criteria will be explained with reference to FIGS. 7(A) and 7(B). FIG. 7(A), whose ordinate and abscissa indicate the total light quantity detected by the four-divided position detecting device of the light-receiving part 45 (see FIG. 1) and time, respectively, is a chart recording the change in the total light quantity detected by the four-divided position detecting device of the light-receiving part 45 (see FIG. 1) in the states of FIGS. 6(A) and 6(B). In this case, as mentioned above, it is determined that the processing objective lens 42 is located at a position corresponding to one end of the line to cut $C_1$ at the time when the light quantity exceeds a predetermined threshold $T_1$.

From the graph of FIG. 7(A), at predetermined intervals (e.g., at individual sampling points), the amount of change in difference obtained by subtracting the previous total light quantity value from the current total light quantity value is calculated. Thus obtained values are plotted in FIG. 7(B) whose ordinate and abscissa indicate the amount of change and time, respectively. In this case, a part exhibiting a positive peak seems to be a point where the change in the total light quantity is the largest, i.e., a part corresponding to the vicinity of the center of an edge (outer edge) of the object S. Therefore, the tracking of the actuator 43 can be started after the differential peak shown in FIG. 7(B) stops changing after the total light quantity shown in FIG. 7(A) becomes the threshold $T_1$.

Figure 8:
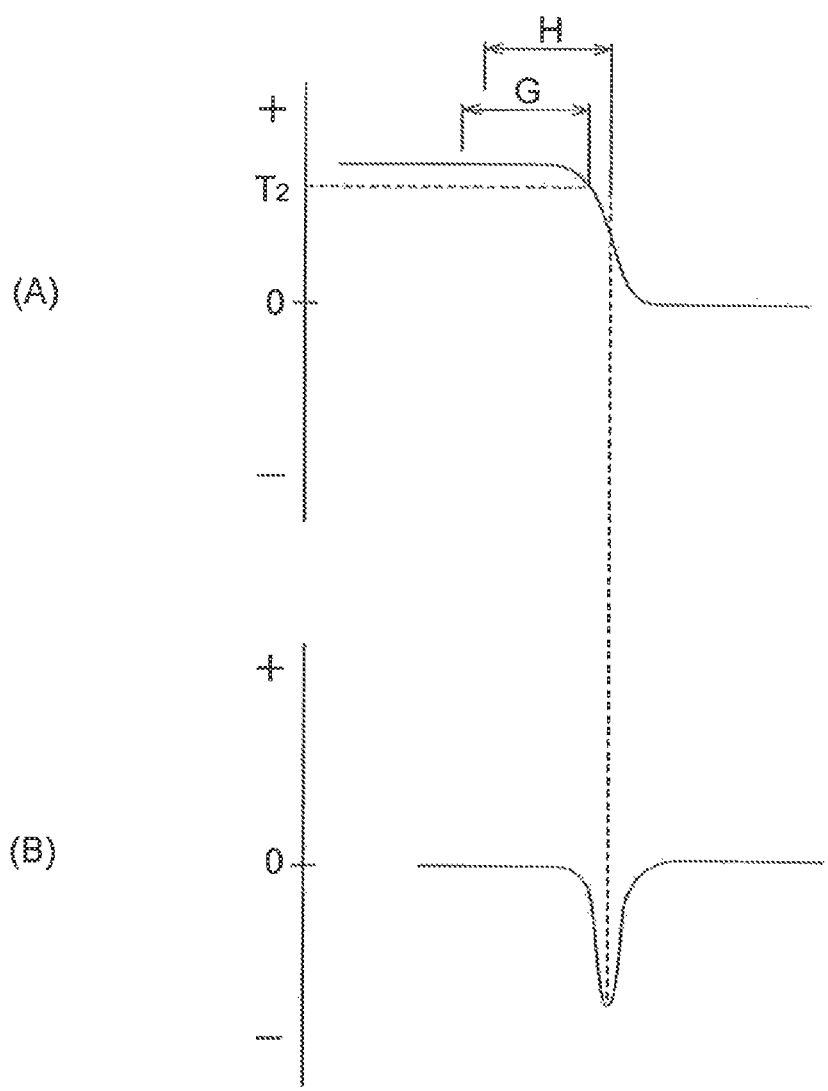
FIG. 8 is a chart for explaining the laser processing method in accordance with the embodiment.

Though the processing objective lens 42 having reached a position corresponding to the other end of the line to cut $C_1$ (FIG. 6(C)) is detected according to the fact that the total light quantity detected by the four-divided position detecting device in the light-receiving part 45 (see FIG. 1) becomes smaller than a predetermined threshold in the foregoing explanation, this is not restrictive, whereby other criteria may also be employed. An example of such criteria will be explained with reference to FIGS. 8(A) and 8(B). FIG. 8(A), whose ordinate and abscissa indicate the total light quantity detected by the four-divided position detecting device of the light-receiving part 45 (see FIG. 1) and time, respectively, is a chart recording the change in the total light quantity detected by the four-divided position detecting device of the light-receiving part 45 (see FIG. 1) in the states of FIGS. 6(B) and 6(C). In this case, as mentioned above, it is determined that the processing objective lens 42 is located at a position corresponding to one end of the line to cut $C_1$ at the time when the light quantity becomes smaller than a predetermined threshold $T_2$.

From the graph of FIG. 8(A), at predetermined intervals (e.g., at individual sampling points), the amount of change in difference obtained by subtracting the previous total light quantity value from the current total light quantity value is calculated. Thus obtained values are plotted in FIG. 8(B) whose ordinate and abscissa indicate the amount of change and time, respectively. In this case, a part exhibiting a negative peak seems to be a point where the change in the total light quantity is the largest, i.e., a part corresponding to the vicinity of the center of an edge (outer edge) of the object S. Therefore, the amount of expansion/contraction of the actuator 43 can be fixed at that corresponding to this part.

The amount of expansion/contraction of the actuator 43 is stored in the circular memory 706 (see FIG. 2) during period G (in the case where the amount of expansion/contraction of the actuator 43 is fixed at the time when the total light quantity becomes smaller than the threshold $T_2$) or period H (in the case where the amount of expansion/contraction of the actuator 43 is fixed at the time when the amount of change in the total light quantity attains a negative peak) in FIG. 8(A). Since the circular memory comprises 64 channels, an average value of the amounts of expansion/contraction of the actuator 43 stored in the first 5 channels of the memory may be determined, for example, and the amount of expansion/contraction of the actuator 43 may be fixed so as to become thus determined average value. In this case, the actuator 43 is fixed at a position corresponding to the main surface height of the object corresponding to the initial quarter of the period C or H in FIG. 8(A), which is more suitably set as the initial position for the next line to cut $C_2$.

Figure 9:
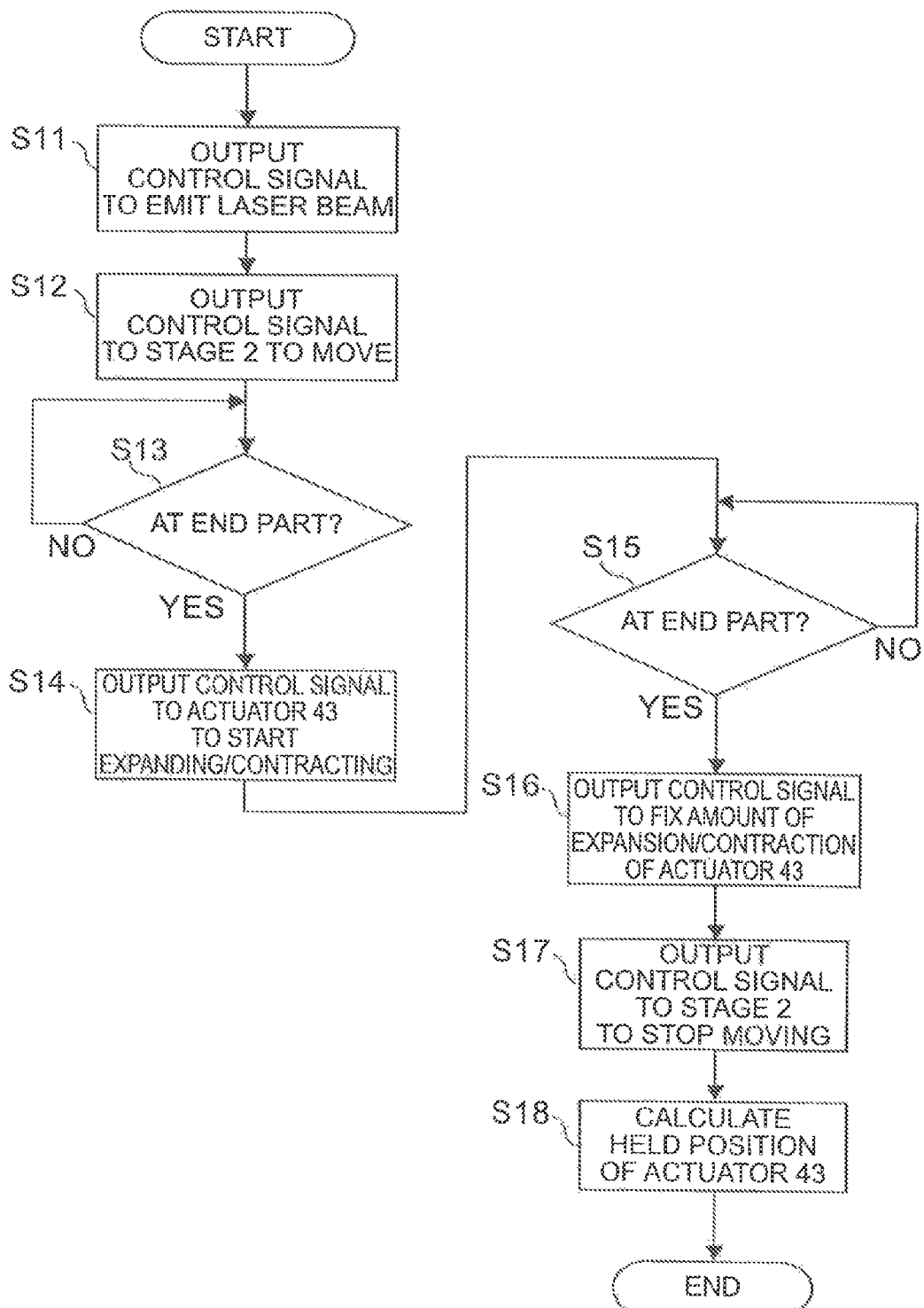
FIG. 9 is a flowchart for explaining the laser processing method in accordance with the embodiment.
Figure 11:
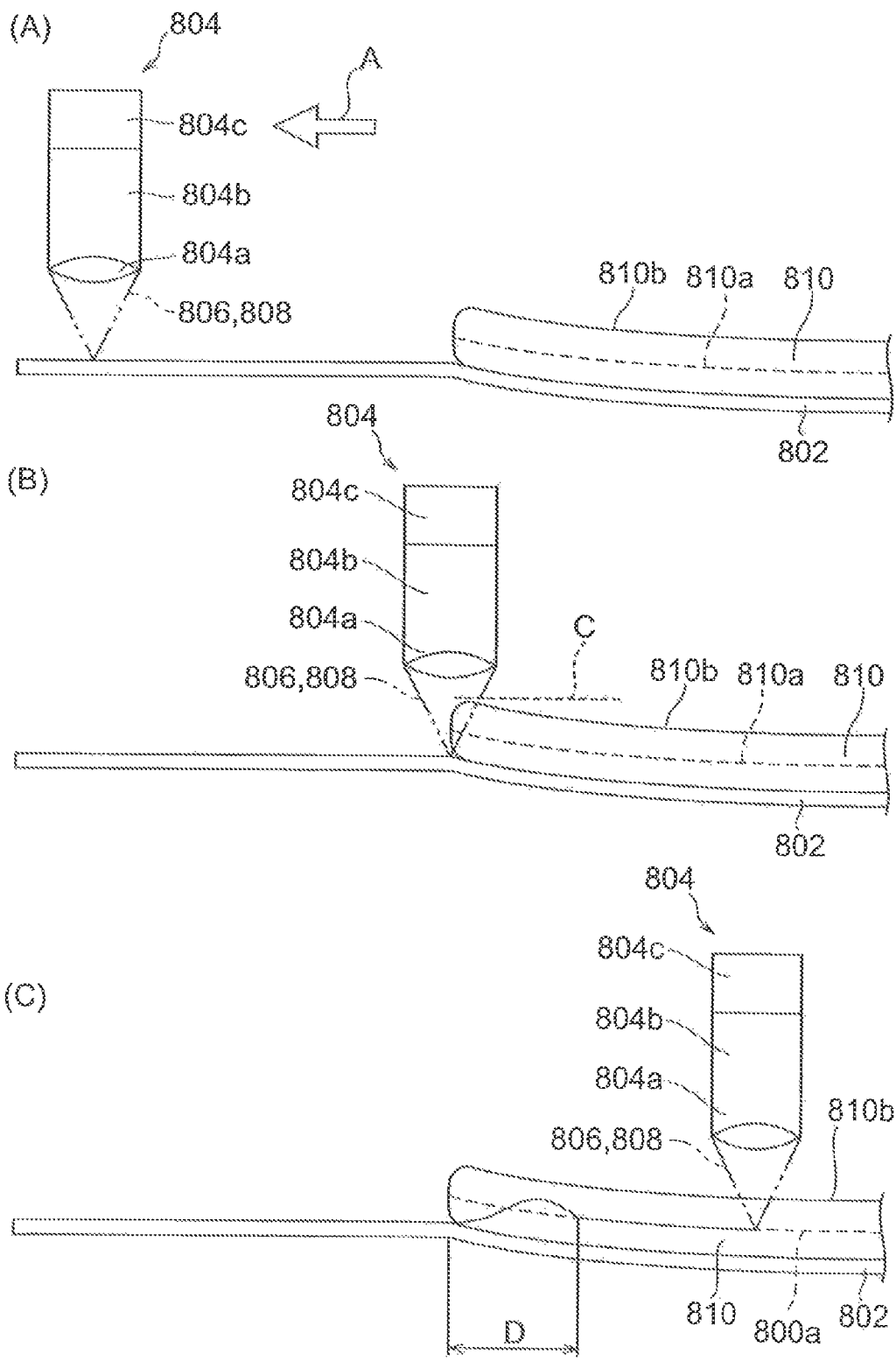
FIG. 11 is a view for explaining details of the studies led to the present invention.

Operations of the laser processing apparatus 1 in this processing step will be explained with reference to the flowchart shown in FIG. 9. Here, the stage 2 and processing objective lens 42 of the laser processing apparatus 1 are assumed to be in the state explained with reference to FIG. 4(C).

The laser emission controller 701 of the control unit 7 outputs control signals to the laser head 13 and laser diode 44 so as to make them emit the processing laser beam L1 and the rangefinding laser beam L2, respectively (step S11). In response to the output of the control signals, the processing laser beam L1 and the rangefinding laser beam L2 are emitted.

The stage controller 702 of the control unit 7 outputs a control signal to the stage 2 so as to move the processing objective lens 42 in the direction of arrow E in FIG. 6(A) (step S12). In response to the output of this control signal, the stage 2 starts moving.

According to the signal outputted from the light-receiving part 45, the end part determiner 705 of the control unit 7 determines whether the processing objective lens 42 is located at an end part of the object S or not (step S13). When it is determined that the processing objective lens 42 is located at an end part of the object S, the end part determiner 705 outputs an instruction signal to the actuator controller 703 so as to make the latter start the expansion/contraction of the actuator 43 such that the astigmatism signal equals the held reference value. The actuator controller 703 outputs the control signal to the actuator 43 so as to make the latter start expanding/contracting in order for the astigmatism signal to equal the held reference value (step S14). In response to the output of this control signal, the actuator 43 expands/contracts according to the displacement of the surface S1 of the object 5, and holds the processing objective lens 42 such that the converging point of the rangefinding laser beam L2 is located at the reference position. Therefore, the modified region R is formed at a position corresponding to the displacement of the surface S1 of the object S (see FIG. 6(B)).

According to the signal outputted from the light-receiving part 45, the end part determiner 705 determines whether the processing objective lens 42 is located at the other end part of the object S or not (step S15). When it is determined that the processing objective lens 42 is located at the end part of the object 5, the end part determiner 705 outputs an instruction signal to the actuator controller 703 so as to make the latter stop the expansion/contraction of the actuator 43. In response to the output of this instruction signal, the actuator controller 703 outputs a control signal to the actuator 43 so as to make the latter stop expanding/contracting and attain a held state (step S16). In response to the output of this control signal, the actuator 43 stops expanding/contracting. When the processing objective lens 42 is located at the point $X_2$ on an extension of the line to cut $C_1$, the stage movement controller 702 outputs a control signal to the stage 2 so as to make the latter stop moving (step S17). Thereafter, an average value of the amounts of expansion/contraction of the actuator 43 stored in the first 5 channels of the circular memory 706 among the amounts of expansion/contraction of the actuator 43 stored in the circular memory 706 is calculated, and the amount of expansion/contraction of the actuator 43 is fixed so as to become this average value (step S18).

The above-mentioned preparatory step and processing step are performed for all the lines to cut $C_1$ to $C_n$ in the object S, whereby respective modified regions R are formed along the lines to cut $C_1$ to $C_n$.

Since this embodiment starts laser processing by emitting the processing laser beam L1 while holding the processing objective lens 42 at the initial position, the influence of fluctuations in the shape of end parts in the object S can be excluded as much as possible.

After forming a modified region in an end part of the object S while holding the processing objective lens 42 at the initial position, the processing objective lens 42 is released from being held, and then the modified region is formed while adjusting the distance between the processing objective lens 42 and the object S to a fixed value, whereby the modified region can stably be formed at a position separated by a predetermined distance from the surface S1 of the object S.

After forming the modified region, the processing objective lens 42 is held so as to be kept from being driven toward the main surface S1 of the object 5, whereby a smooth transition is possible when shifting to the processing of the next line to cut.

In the preparatory step of the next line to cut, the position of the processing objective lens 42 with respect to the main surface S1 is set to the position based on the amount of expansion/contraction of the actuator 43 stored before a predetermined time from the time when the processing objective lens 42 is held so as to be kept from being driven, the influence of fluctuations in the shape of end parts in the object S can be excluded as much as possible.

Since the modified region can stably be formed along the line to cut, when cutting/separating a wafer, which is an object to be processed, into chips by expanding the dicing film 2a and so forth after forming the modified region, the wafer can always be cut stably with a favorable cutting quality even when cutting a large amount of wafer.

INDUSTRIAL APPLICABILITY

The laser processing method and laser processing apparatus of the present invention can efficiently carry out laser processing while minimizing the deviation of the converging point of a laser beam in end parts of an object to be processed.

The invention claimed is:

1. A laser processing apparatus for cutting a semiconductor substrate with a first laser beam while converging the first laser beam, and forming a modified region within the substrate along a horizontal cutting line in the substrate, the apparatus comprising:
a lens for converging the first laser beam while the first laser beam is irradiating the substrate such that a converging point is positioned within the substrate;
moving means for moving the substrate and the lens relative to each other along a main surface of the substrate;
a holder for holding the lens such that the lens is capable of freely expanding and retracting in a vertical direction with respect to the main surface; and
control means for controlling respective behaviors of the moving means and the holder;
wherein the control means causes the holder to hold the lens at an initial position with respect to the main surface of the substrate in the vertical direction, the initial position being set so that the converging point is located at a predetermined position within the substrate;
wherein, while the first laser beam is irradiating the substrate, the control means prohibits movement of the lens from the initial position in the vertical direction by outputting an auto-focus off instruction signal prohibiting expansion/contraction of an actuator of the lens, and the control means controls the moving means so as to move the substrate and the lens relative to each other along the main surface, thereby forming an initial portion of the modified region in one end part of the cutting line; and
wherein, while the first laser beam is irradiating the substrate, and after forming the initial part of the modified region in the one end part of the cutting line, the control means controls the holder so as to release the lens from being prohibited from moving from the initial position in the vertical direction by outputting an auto-focus on instruction signal initiating allowance of expansion/contraction of the actuator of the lens, and moves the lens and the substrate relative to each other along the main surface of the substrate while at the same time adjusting a distance of a gap between the lens and the main surface of the substrate, thereby forming a remainder portion of the modified region in a part of the cutting line that is different than the one end part.

2. The laser processing apparatus according to claim 1, wherein the first laser beam and a second laser beam for measuring a displacement of the main surface are converged by the lens into the substrate on the same axis; and wherein the control means controls the holder so as to release the lens from being prohibited from moving from the initial position in the vertical direction when the quantity of detected light of the second laser beam reflected by the main surface exceeds a predetermined threshold.

3. The laser processing apparatus according to claim 1, wherein the first laser beam and a second laser beam for measuring a displacement of the main surface are converged by the lens into the substrate on the same axis; and wherein the control means controls the holder so as to release the lens from being prohibited from moving from the initial position in the vertical direction when an amount of change in the quantity of detected light of the second laser beam reflected by the main surface becomes a maximum value.

4. The laser processing apparatus according to claim 1, wherein, after forming the initial portion of the modified region in the one end part of the cutting line, the control means controls the holder so as to release the lens from being prohibited from moving from the initial position in the vertical direction and moves the lens and the substrate relative to each other along the main surface while at the same time adjusting a distance of a gap between the lens and the main surface of the substrate, thereby forming a remainder portion of the modified region in a part of the cutting line that is different than the one end part; and wherein, during the forming of the initial portion of the modified region in the one end part of the cutting line, the control means controls the holder so as to hold the lens such that the lens is kept from being driven toward the main surface while at the same time moving the lens and the substrate relative to each other along the main surface.

5. The laser processing apparatus according to claim 4, wherein the first laser beam and a second laser beam for measuring a displacement of the main surface are converged by the lens into the substrate on the same axis; and
wherein, during the forming of the initial portion of the modified region in the one end part of the cutting line, the control means controls the holder so as to hold the lens such that the lens is kept from being driven toward the main surface when the quantity of detected light of the second laser beam reflected by the main surface becomes smaller than a predetermined threshold.

6. The laser processing apparatus according to claim 4, wherein the first laser beam and a second laser beam for measuring a displacement of the main surface are converged by the lens into the substrate on the same axis; and
wherein the control means controls the holder so as to hold the lens such that the lens is kept from being driven toward the main surface when the quantity of detected light of the second laser beam reflected by the main surface becomes a minimum value.

7. The laser processing apparatus according to claim 4, wherein the cutting line includes first and second cutting lines;
wherein the apparatus further comprises displacement storage memory for successively storing respective displacements of the main surface in unit time zones; and
wherein the control means sets a position based on the displacement stored in the unit time zone earlier by a predetermined number than the unit time zone where the lens is held so as to be kept from being driven in the first cutting line as the initial position in the second cutting line.

* * * * *